United States Patent
Kwak et al.

(10) Patent No.: US 6,225,379 B1
(45) Date of Patent: May 1, 2001

(54) EPOXY RESIN COMPOSITION FOR BONDING SEMICONDUCTOR CHIPS

(75) Inventors: Jae-Sung Kwak; Byung-Hoon Moon, both of Seoul (KR)

(73) Assignee: National Starch and Chemical Investment Holding Corporation, Wilmington, DE (US)

( * ) Notice: Subject to any disclaimer, the term of this patent is extended or adjusted under 35 U.S.C. 154(b) by 0 days.

(21) Appl. No.: 09/347,794

(22) Filed: Jul. 6, 1999

(30) Foreign Application Priority Data

Jul. 7, 1998 (KR) .................................. 98/27292

(51) Int. Cl.$^7$ .............................. C08K 3/08; C08L 63/02

(52) U.S. Cl. ........................................... 523/457; 523/458

(58) Field of Search ...................... 523/457, 458

(56) References Cited

U.S. PATENT DOCUMENTS 5,582,772 * 12/1996 Kwak ................................... 252/518

* cited by examiner

*Primary Examiner*—Robert Dawson
*Assistant Examiner*—D. Aylward
(74) *Attorney, Agent, or Firm*—Jane E. Gennaro

(57) ABSTRACT

Disclosed is an adhesive resin composition for bonding semiconductor chips comprising an epoxy resin component, a curing agent, a diluent, a curing promoter, a thixotropic agent, and an inorganic filler component. The resin component is approximately 10–50% by weight, and the inorganic filler component is approximately 50–90% by weight and comprises a copper ingredient and a silver ingredient. The copper ingredient is selected from the group consisting of CuO, $Cu_2O$, with the mixtures thereof being approximately 0.1–50% by weight based on the total weight of said inorganic filler component. The silver ingredient is approximately 50–99.0% by weight based on the total weight of the inorganic filler ingredient.

6 Claims, 7 Drawing Sheets

EPOXY RESIN COMPOSITION FOR BONDING SEMICONDUCTOR CHIPS

The priority of Korean patent application 98/27292, filed Jul. 7 1998, is claimed under 35 USC 119.

BACKGROUND OF THE INVENTION (a) Field of the Invention

The present invention relates to a die attach adhesive composition for bonding semiconductor chips to lead frames, and more particularly, to a die attach adhesive composition that has superior modulus characteristics, bonding power, adhesion strength and workability, thereby enabling use with semiconductor chips in a wide range of sizes.

(b) Description of the Prior Art

Typically, semiconductor packages comprise lead frames/substrates in which semiconductor chips are bonded onto lead frame paddles via adhesives. FIG. 1 shows a thin quad flat package (TQFP) 1, which is a type of surface-mounting semiconductor, in which a semiconductor chip 2 is mounted on a semiconductor chip paddle 3a of a lead frame 3, by an adhesive layer 6. A bond pad (no reference numeral given) on the mounted semiconductor chip 2 and internal leads 3b are electrically connected by conductive wires 4. The semiconductor chip 2 and the conductive wires 4 are protected from the exterior by a molded encapsulating resin compound 5, and external leads 3c are soldered on, for example, a circuit board, the external leads 3c serving as external connection terminals.

In the above, die attach adhesive compositions are used in bonding the semiconductor chip 2 on the paddle 3a of the lead frame 3. Here, it is necessary for such adhesive compositions to have exceptional physical and chemical properties after the composition is cured, as well as provide a sufficient level of workability. Necessary physical properties for the die attach adhesive compositions include a low coefficient of thermal expansion, high adhesive strength, high thermal- and electroconductivity, and durability, while the required chemical properties include high chemical resistance and low impurity content. With regard to the workability of the adhesive compositions, it is necessary for the same to have a suitable level of viscosity and rate of cure.

Die attach adhesive compositions meeting the above requirements and typically used include an epoxy base resin, which may have substituents; a curing agent, containing an amine compound; a diluent, such as epoxide or butyl carbitol acetate; an adhesion promoter, such as silane or dicyandiamide; a thixotropic agent, such as colloidal magnesium silicate; and other additive agents, such as silicone. Here, depending on the required characteristics, intended use, etc., modifications can be made to the epoxy resin adhesive composition to meet varying demands.

Particularly, Ag flakes are commonly used as a filler to provide the die attach adhesive compositions with superior thermal and/or electrical conductivity. Because of good dispersion in organic resin systems, silver has the advantage of easily controlling the composition's thixotropy needed upon dispersion or die placement. However, silver does not provide sufficient adhesive strength between the semiconductor chip and the chip paddle of the lead frame, thereby reducing package reliability. For example, delamination can occur at the interface between the semiconductor chip and the chip paddle and/or cracks in the package may develop.

The above is particularly true in 'hard' modified die attach compositions that are high in modulus. In contrast, such problems do not occur in 'soft' modified compositions. However, when a wire bonding process (a high temperature process of 240° C.), subsequent to the semiconductor chip-mounting process, is performed by a bonding machine, minute vibrations are generated causing defects in the wire bonding, which the 'soft' composition cannot resist.

In more detail, when the capillary of the bonding machine is pressure-welded into the outside edge of the surface of the semiconductor chip, the adhesive layer beneath the semiconductor chip is slightly distorted by the pressure of the capillary load. When the capillary is released from the semiconductor chip, damped vibration occurs, causing defects in the wire bonding or a tilt in the mounting of the semiconductor chip slant. Accordingly, 'soft' modified adhesive compositions are unsuitable for the use in packages on which small semiconductor chips are mounted since the minute vibrations cannot be absorbed.

As with 'hard' modified epoxy resin compositions, 'intermediate' modified epoxy resin compositions, which are in modulus between 'hard' and 'soft' epoxy resin compositions, do not provide sufficient adhesive strength. As a result, the problems of interfacial delamination and/or cracking remain.

SUMMARY OF THE INVENTION

The present invention has been made in an effort to solve the above problems.

It is an object of the present invention to provide an 'intermediate' adhesive composition having a high level of modulus such that wire bonding defects caused by wire sticking do not arise.

It is another object of the present invention to provide a die attach adhesive composition for bonding semiconductor chips which provides substantial adhesive strength such that the occurrence of interface delamination and/or cracking is prevented.

It is yet another object of the present invention to provide a die attach adhesive composition which both can be used for semiconductor chips of a wide variety of sizes and provides for a high level of workability.

To achieve the above objects, the present invention provides a die attach adhesive resin composition for bonding semiconductor chips. The adhesive composition comprises an epoxy resin component, a curing agent, a diluent, a curing promoter and a thixotropic agent, and an inorganic filler component. The resin component is approximately 10–50% by weight, and the inorganic filler component is approximately 50–90% by weight and comprises a copper ingredient and a silver ingredient. The copper ingredient is selected from the group consisting of CuO, $Cu_2O$, and mixtures thereof and amounts to approximately 0.1–50% by weight based on the total weight of said inorganic filler component; the silver ingredient amounts to approximately 50–99.0% by weight based on the total weight of the inorganic filler ingredient.

According to a feature of the present invention, the copper ingredient is approximately 5–25% by weight based on the total weight of the inorganic filler component.

According to another feature of the present invention, the resin component is 20–40% by weight and the inorganic filler component is 60–80% by weight.

According to yet another feature of the present invention, the composition has a modulus 2 to $4 \times 10^9$ Pa at 0° C., and the modulus gradually decreases at temperatures between 25 and 150° C., and decreases to $7 \times 10^7$–$3 \times 10^9$ Pa at above 150° C.

According to still yet another feature of the present invention, the composition ranges in viscosity from 8,000 to 20,000 cps at 25° C.

According to still yet another feature of the present invention, the composition gives an adhesive layer, formed between a semiconductor chip and a paddle of a lead frame, ranging in adhesive strength from 100 to 170 Kgf/cm$^2$ after cure.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
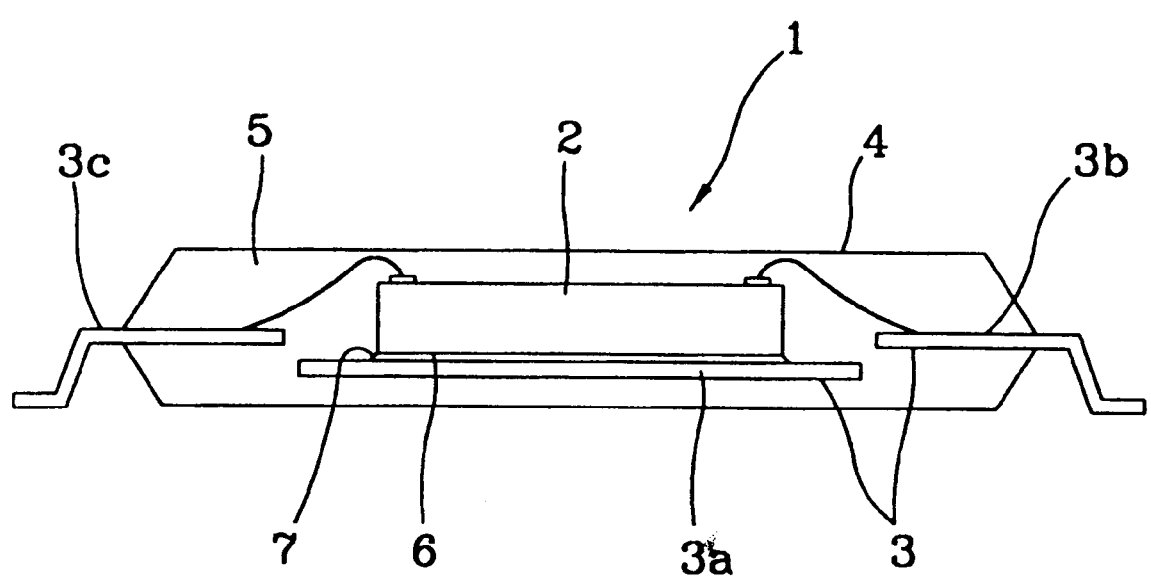
FIG. 1 is a schematic cross-sectional view of a conventional TQFP-type semiconductor package.

Various die attach adhesive compositions for use in bonding semiconductor chips are known. Depending on the required characteristics, intended use, etc., modifications can be made to the composition to meet varying demands. In addition to epoxy base resins which may have substituents, there are used various components for the adhesive composition including amine curing agents, such as azo compounds; diluents, such as epoxides and butyl carbitol acetate; thixotropic agents, such as colloidal magnesium silicate; and other additives, such as silicon. Except for the epoxy monomer, amounts for all of the components may be varied according to necessity, and such adjustments do not limit the invention.

The term "hard modified epoxy resin compositions", as used herein, refers to epoxy resin-based adhesive compositions having a modulus of 2.5 to 4×10$^9$ Pa at a temperature between 0 and 100° C., which rapidly decreases at a temperature between 100 and 150° C., and is 2 to 4×10$^8$ Pa at above 150° C. The term "soft modified epoxy resin compositions", as used herein, refers to epoxy resin adhesive compositions having a modulus of 2.5 to 4.5×10$^9$ Pa at 0° C., which rapidly reduces at a temperature between 0 and 70° C., and is 1 to 4×10$^7$ Pa at above 70° C. Finally, the term "intermediate epoxy resin compositions", as used herein, refers to epoxy resin adhesive compositions having a modulus of 2 to 4×10$^9$ Pa at 0° C., which gradually reduces at a temperature between 25 and 150° C., and is 7×10$^7$ to 3×10$^8$ at above 150° C. However, these parameters can vary slightly and are in no way limiting.

Generally, since the adhesive layers hardened from the hard epoxy resin compositions are of high crosslinking density and of low flexibility, only a minimal amount of minute vibrations attributed to the bonding machine upon wire sticking occurs, resulting in a low rate of non-sticking in the wire bonding. However, the adhesive layer experiences a relatively high level of warpage because of the large difference in the coefficients of thermal expansion between the adhesive layer, and the semiconductor chip and the paddle. Thus, the hard epoxy resin compositions are suitable for mounting semiconductor chips as small as 100×100 mil$^2$ in size. In addition, they have high glass transition temperatures (Tg), but show low adhesive strength.

In contrast with the hard adhesive layers, the adhesive layers hardened from the soft epoxy resin compositions are low in crosslinking density, and high in flexibility. Accordingly, these adhesive layers allow the minute vibrations attributed to the bonding machine upon wire sticking, leading to a high rate of non-sticking in the wire bonding. Advantageously, the adhesive layers experience only a small degree of warpage, thereby making the soft epoxy resin compositions suitable for mounting semiconductor chips as large as 400×400 mil$^2$. Such adhesive layers are relatively low in Tg, but very high in adhesive strength.

As for the adhesive layers hardened from the intermediate epoxy resin compositions, they have crosslinking densities which are between the 'hard' and the 'soft' crosslinking densities, thus showing intermediate flexibility. Minimal minute vibrations attributed to the bonding machine upon wire sticking are allowed in the intermediate adhesive layers such that the rate of non-sticking in the wire bonding is low. Their warpage is also intermediate in magnitude. However, the intermediate epoxy resin compositions are low in adhesive strength.

Accordingly, the present invention is related to an epoxy resin composition for bonding semiconductor chips, which has a suitable level of flexibility (between the levels realized in the 'hard' and 'soft' epoxy resin compositions) in addition to showing a high degree of adhesive strength. This suitable level of flexibility does not allow the minute vibrations which caused by the bonding machine upon wire sticking, thereby lowering the non-sticking rate of the bonding wire while the high degree of adhesive strength effectively prevents interface delamination and/or package cracking. Thus, the epoxy resin composition can be effectively applied for various sizes, from small to large sizes, of semiconductor chips.

The adhesive composition for bonding semiconductor chips, according to the present invention, comprises an epoxy resin modified with an inorganic filler component comprising a silver and a copper ingredient selected from CuO, Cu$_2$O and the mixtures thereof. In the epoxy resin adhesive composition for bonding semiconductor chips, the epoxy resin amounts to approximately 10–50% by weight while the inorganic filler component amounts correspondingly to approximately 10–90% by weight. Here, if the resin component is below 10% by weight of the compositions, a homogeneous mixture with the inorganic filler component is difficult to obtain and the resulting composition is poor in fluidity and workability. On the other hand, if the resin component exceeds 50% by weight of the composition, it is highly likely that a bleedout or kerf creep phenomenon will occur. That is, the resin composition creeps up along the side of the semiconductor chip to pollute the bond pad of the semiconductor chip. Thus, the resin component amounts preferably to approximately 20–40% by weight based on the total weight of the composition, more preferably to approximately 25–35% by weight, and most preferably to approximately 30% by weight.

The inorganic filler component comprises approximately 0.1–50% by weight of a copper ingredient selected from CuO, $Cu_2O$, and the mixtures thereof, and approximately 50–99% by weight of silver. While the copper ingredient serves as to reinforce adhesion, the silver functions to make it easy to control the thixotropy of the epoxy resin, as well as to provide thermal conductivity. The silver pieces may be added in the shape of spheres or flakes, preferably flakes to provide better fluidity. However, the choice of shape is optional in the present invention.

Preferably, the composition according to the present invention ranges in viscosity at 25° C. from about 8,000 to 20,000 cps. For example, if the composition has a viscosity of less than 8,000 cps, there is a high probability that a bleed-out or kerf creep phenomenon will occur. On the other hand, if the composition has a viscosity of more than 20,000 cps, the composition is difficult to treat with an auto-dispenser.

After a semiconductor chip is mounted on a paddle by using the composition of the invention, the cured adhesive layer has an adhesive strength of approximately 100–170 $kgf/cm^2$ depending on the contents of the components.

The copper ingredient in the composition of the invention, selected from CuO, $Cu_2O$ and the combinations thereof, is able to effectively prevent the occurrence of interface delamination and/or package cracking, thereby greatly enhancing the reliability of the semiconductor package.

A description will be given of the prevention mechanism below. First, because strong hydrogen bonds are formed between the oxygens of CuO and/or $Cu_2O$, and the epoxy rings (—CH—CH—) of the epoxy molding compound (EMC) of the resin encapsulant, the adhesive strength at the interface between the epoxy resin composition and the EMC of the resin encapsulant is stronger than when only Ag is used. Therefore, although there is a large difference between the semiconductor chip (2–4 ppm/° C. in a coefficient of thermal expansion) and the EMC and the chip paddle made of copper, (16–17 ppm/° C. in coefficient of thermal expansion) interface delamination and/or package cracking in an adhesive fillet 7 of FIG. 1, a slant adhesive layer squeezed out of the lower outside edge of the semiconductor chip mounted on the paddle can be effectively prevented. In addition, there is a hydrogen bond between a curing promoter, such as silane or silanol, which is usually contained in the EMC and CuO and/or $Cu_2O$, thereby providing additional adhesive strength. Hence, the presence of CuO and/or $Cu_2O$ in the adhesive layer interposed between the semiconductor chip and the paddle allows the adhesive layer to more tightly bond to the EMC than when conventional Ag fillers are used, and such interface delamination and/or package cracking are more effectively prevented. Moreover, where the adhesive epoxy resin composition further comprises a curing promoter, such as $SiH_4$, hydrogen bonds are also formed between the curing promoter and the copper ingredient, contributing to effectively preventing the interface delamination and/or package cracking. Furthermore, since the copper ingredient, CuO and/or $Cu_2O$, shows a good compatibility with the semiconductor chip paddle, made of non-plated copper, higher adhesive strength can be obtained when using the copper ingredient as a filler relative to when using Ag only.

In the epoxy resin composition of the present invention, the copper ingredient selected from the group consisting of CuO, $Cu_2O$, and mixtures thereof, is used in an amount of about 0.1–50% by weight based on the total weight of the inorganic filler; preferably about 5–25% by weight, more preferably about 7–20% by weight, and most preferably 8–15% by weight. For example, if the copper ingredient amounts to below 0.1% by weight the intended adhesive strength cannot be obtained. On the other hand, if the copper ingredient amounts to above 50% by weight, the resulting composition has a viscosity of more than 20,000 cps at which workability rapidly deteriorates, for example, the composition is difficult to dispense.

Based on the total weight of the inorganic filler, Ag is used at an amount of about 50–99.9% by weight, and preferably about 70–95% by weight. For example, if Ag amounts to below 50% by weight, it is not easy to control the composition's thixotropy, so that its workability is deleteriously affected. In addition, this insufficient amount of Ag makes the composition poor in thermal conductivity, lowering the emitting efficiency of the heat which is generated while the semiconductor chip is being operated. On the other hand, if Ag amounts to above 99.9% by weight, there is little improvement in adhesive strength, so that ther is a high possibility for interface delamination and/or package cracking to occur. The epoxy resin composition of the present invention, if necessary, may further comprise other types of inorganic fillers.

Resin Composition Specimens and Materials

Epoxy resin compositions for bonding semiconductor chips were prepared as indicated in Table 1, below. In Table 1, the resin component consisted of 75% by weight of an epoxy base resin and 25% by weight of the additives comprising amine, epoxide, silane, colloidal magnesium silicate, and CAB-O-SIL fuming silica, and were used at an amount of 30% by weight based on the total weight of the inorganic component.

Figure 2:
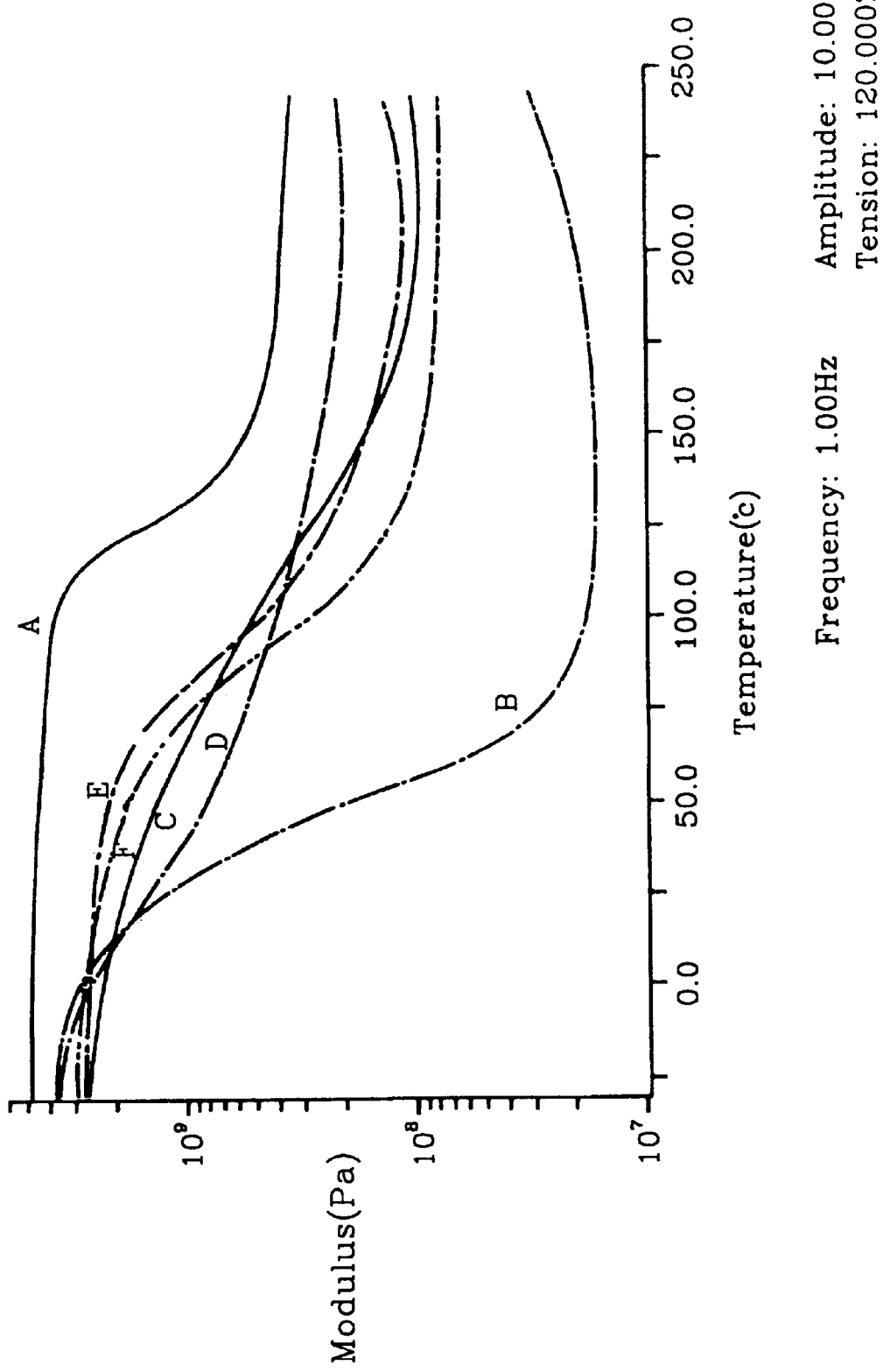
FIG. 2 is a graph illustrating modulus variations of composition specimens according to changes in temperature.

These compositions' modulus was measured while temperature was elevated from −50° C. to 250° C. at a speed of 5° C./min. The changes of modulus were scanned by using a thermal analyzer, such as that sold by Perkin-Elmer, identified as 7 Series Thermal Analysis system and are given as shown in FIG. 2.

TABLE 1

| | Composition | | |
|---|---|---|---|
| | Resin[1] | $CuO/Cu_2O$[2] | Ag[3] |
| Example | 30 | 10 | 90 |
| C. Example I | 30 | — | 100 |
| C. Example II | 30 | — | 100 |
| C. Example III | 30 | — | 100 |
| C. Example IV | 30 | — | 100 |
| C. Example V | 30 | — | 100 |

[1]weight % based on 100 weight % of the inorganic filler
[2]weight % based on total weight of the inorganic filler
[3]weight % based on total weight of the inorganic filler (i) Composition of Comparative Example 1

There was used a modified epoxy resin system, such as that sold by ABLESTIK with the tradename of "ABLEBOND" 84-1LMISR4, which has viscosity if 8,000 cps at 25° C., a coefficient of thermal conductive of 2.5 W/m° K at 121° C., a glass transition temperature of 120° C., and a coefficient of thermal expansion of $40 \times 10^{-6}$ in/in/° C.

In FIG. 2, this 'hard' epoxy resin composition is shown as Curve A.

(ii) Composition of Comparative Example II

There was used a modified epoxy resin system, such as that sold by Johnson Mathey with the tradename of JM 2500 AN, which has a viscosity of 3,000–6,000 cps at 25° C., a coefficient of thermal conductivity of 0.5 W/m° K at 121° C., and a glass transition temperature of 65° C.

In FIG. 2, this 'soft' epoxy resin composition is shown as Curve B.

(iii) Composition of Example

An intermediate epoxy resin composition was prepared from the composition of Comparative Example II by adding $CuO/Cu_2O$ and Ag, and using a modification method well known in the art.

In FIG. 2, this 'intermediate' epoxy resin composition is shown as Curve C.

(iv) Compositions of Comparative Example III to V

'Intermediate' epoxy resin compositions which show the change of modulus with temperature, as in Curves D, E and V of FIG. 2, were prepared by adding Ag, but not $CuO/Cu_2O$, and using a modification method well known in the art.

(v) EMC to Be Molded Into Resin Encapsulant

There was used an EMC commercially available from Sumitomo Co., identified as model EME 7320CR. The EMC has the following conditions:

Tg: 140° C.

Coefficient of Thermal Expansion α1 $1.3 \times 10^{-5}$/° C.
α2 $5.2 \times 10^{-5}$/° C.

Molding Conditions: Curing at 175° C./120 sec

After-Curing Conditions: 175° C./6hr (vi) Lead Frame

TQFP 100 LD Paddle: $5 \times 5$ mm$^2$ in size

144 LD Paddle: $11.5 \times 11.5$ mm$^2$ in size (vii) Test Die: $98 \times 98$ mil$^2$ and $415 \times 381$ mil$^2$ (viii) Observation: Scanning Acoustic Tomographer, made by Sonix

Measurement of Adhesive Strength

Stud pull tests were performed at room temperature by using the Sebastian device made by Guadgroup Co., and the adhesive strength of each of the specimens was determined by measuring a total of five times, the strength at rupture of the adhesive layer cured from each of the specimens, then averaging the measurements. The results are given as shown in Table 2 below. As for the composition of Comparative Example 2, its adhesive layer showed a value of more than 150 kgf/cm$^2$, the upper limit of the measurement, and rupture occurred at other areas, and not on the adhesive layer itself.

TABLE 2

| | in Kgf/cm$^2$ | | | | | |
|---|---|---|---|---|---|---|
| | 1 | 2 | 3 | 4 | 5 | Avg. |
| Example | 153.5 | 115.0 | 116.2 | 121.4 | 118.1 | 124.8 |
| C. Example I | 40.9 | 50.5 | 44.1 | 48.7 | 56.8 | 48.2 |
| C. Example II | — | — | — | — | — | — |
| C. Example III | 647 | 71.5 | 61.7 | 75.0 | 52.4 | 65.1 |
| C. Example IV | 73.9 | 68.0 | 76.7 | 68.1 | 52.7 | 67.9 |
| C. Example V | 78.6 | 67.7 | 72.5 | 70.6 | 65.6 | 71.0 |

The data of Table 2 show that the 'soft' composition specimen of Comparative Example II has the highest adhesive strength and that the 'intermediate' composition specimen of Example has a high adhesive strength of 110–155 kgf/cm$^2$, which is comparable with that of the 'soft' composition specimen. On the other hand, the 'intermediate' composition specimens of Comparative Example III to IV are only slightly better in adhesive strength that the 'hard' composition specimen of Comparative Example I.

Therefore, as apparent from the data, the unexpected high adhesive strength of the 'intermediate' epoxy resin composition according to the present invention is attributable to the addition of CuO and/or $CU_2O$.

Test for Interface Delamination

Semiconductor chips $98 \times 98$ mil$^2$ and $415 \times 381$ mil$^2$ in size were mounted on $5 \times 5$ mm$^2$ and $11.5 \times 11.5$ mm$^2$ paddles, respectively, using the modified epoxy resin compositions of Example and Comparative Examples I to IV, after which wire bonding was performed followed by molding resin encapsulants. Subsequently, after letting the semiconductor chips and paddles stand for 168 hours at 30° C. under a relative humidity of 60%, the resulting packages were subjected to soldering simulation. An SAT was utilized to determine whether interface delamination occurred.

Figure 3A:
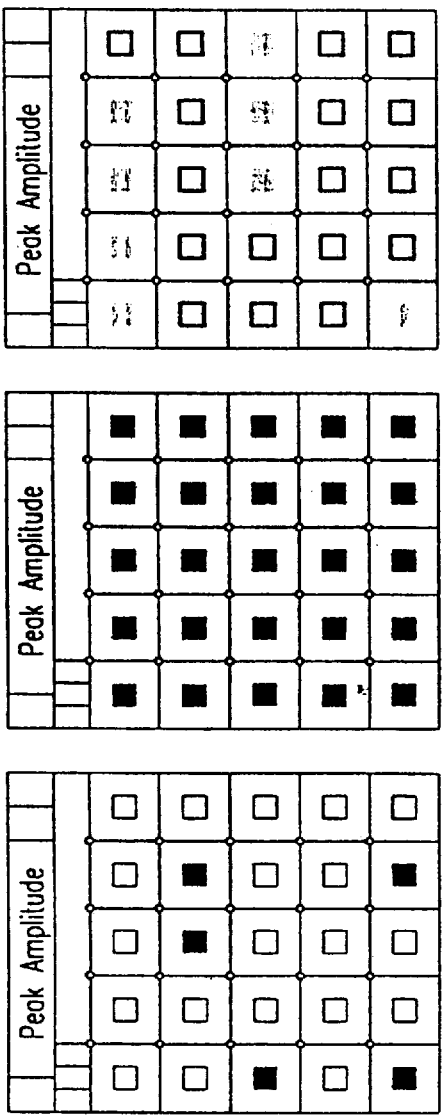
FIGS. 3a and 3b are scanning acoustic tomographs (SATs) showing interface delamination states of small-size semiconductor chip-mounting packages which have undergone severe conditions for a predetermined amount of time.
Figure 3B:
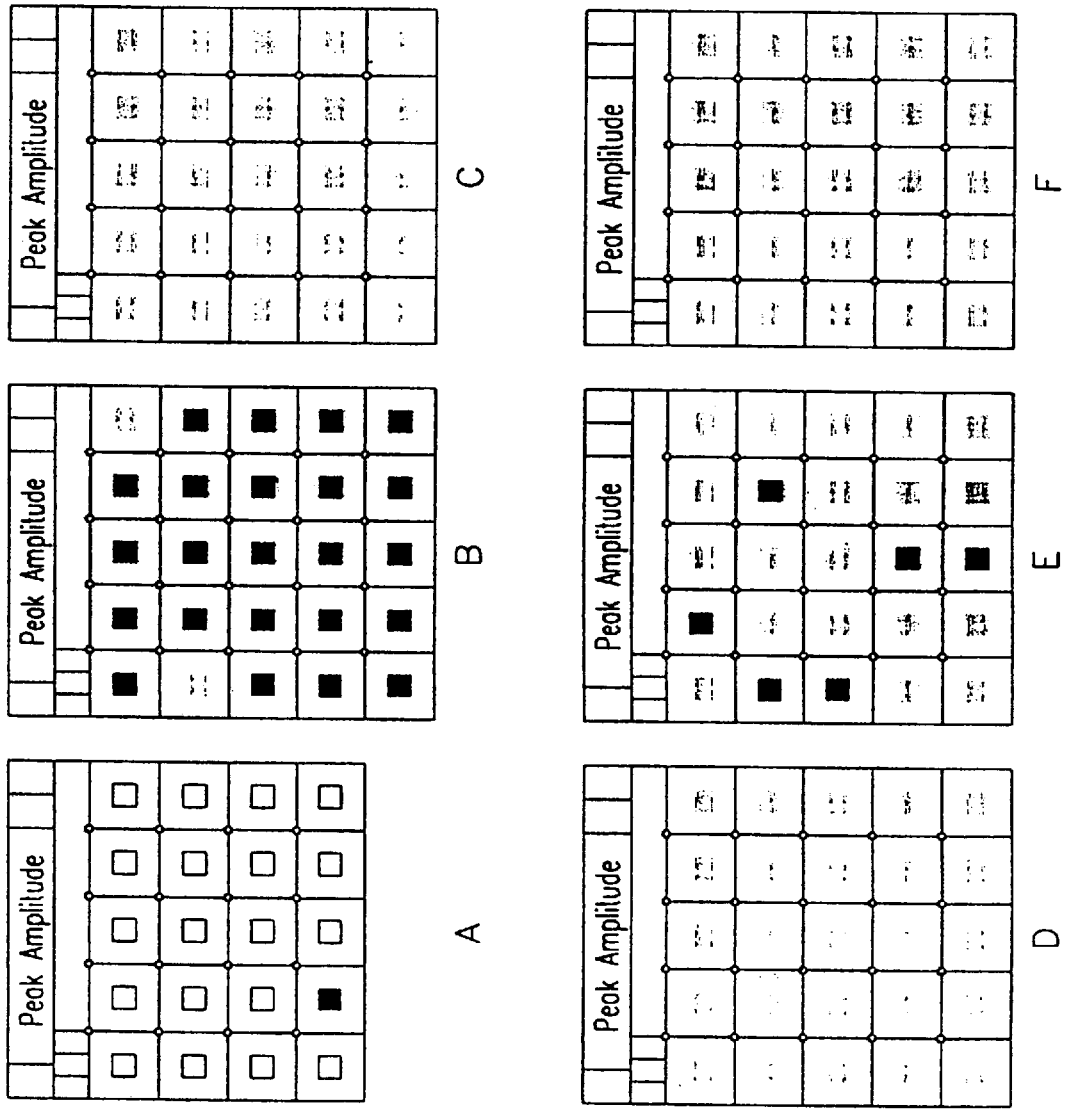
Figure 4A:
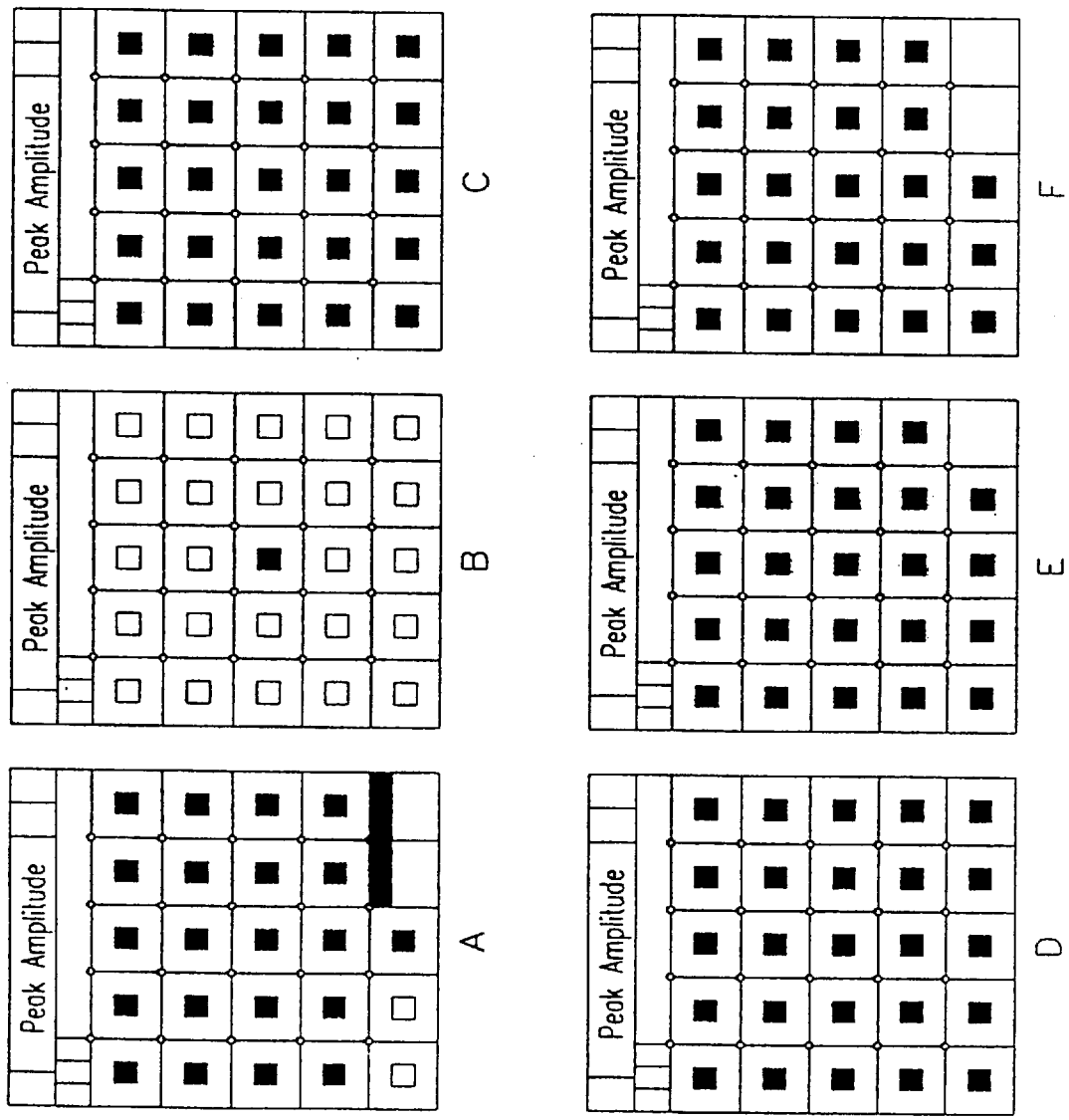
FIGS. 4a and 4b are SATs showing interface delamination states of large-size semiconductor chip-mounting packages which have undergone severe conditions for a predetermined amount of time.
Figure 4B:
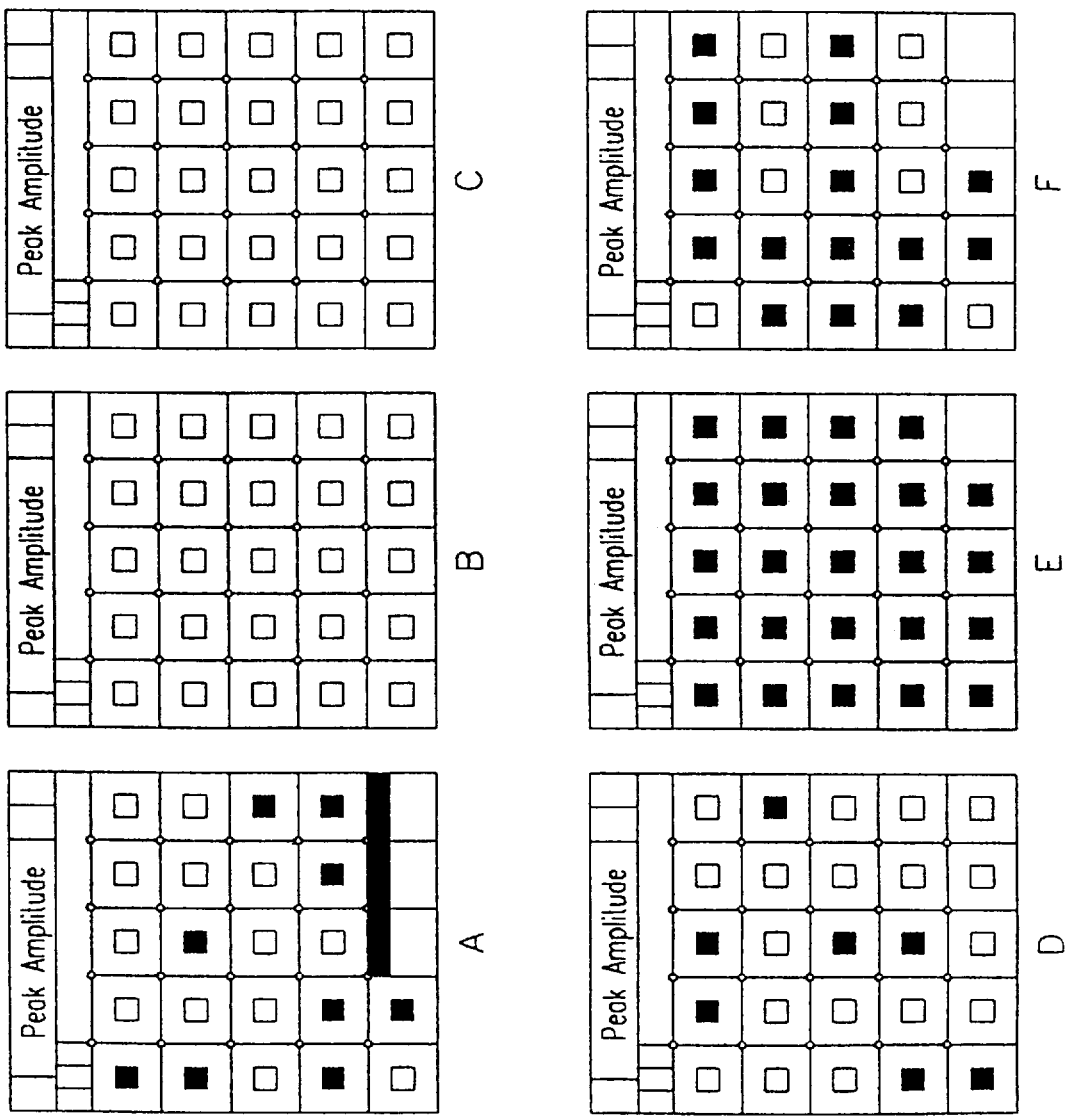

FIG. 3 shows the semiconductor chips with a size of $98 \times 98$ mil$^2$ mounted on the paddles with a size of $5 \times 5$ mm$^2$ in tomography, FIG. 4 shows the semiconductors chips with a size of $415 \times 381$ mil$^2$ mounted on the paddles with a size of $11.5 \times 11.5$ mm$^2$. In the drawing, dark portions represent the portions at which interface delamination occurs. While FIGS. 3a and 4a are tomographs of the packages whose external leads were subjected to vapor phase soldering (VPS) at 215° C., FIGS. 3b and 4b are tomographs of the packages which were subjected to infrared reflow at 235° C.

With the use of the 'hard' epoxy resing composition A, minimal interface delamination resulted in the packages in which small size semiconductor chips were mounted, as shown in panel A of FIG. 3a and 3b, while a substantial amount of interface delamination occurred in the packages in which large size semiconductor chips were mounted, as shown in panel A of FIGS. 4a and 4b. Irrespective of chip sizes, the packages which were subjected to VPs at 215° C. resist interface delamination better than those which were subjected to IR flow at 235° C. From these results, it is apparent that composition specimen A is suitable only for small size packages.

With the use of the 'soft' epoxy resin composition B, interface delamination occurred in most of the packages in which small size semiconductor chips were mounted, as shown in panel B of FIGS. 3a and 3b. On the other hand, only a small amount of interface delamination occurred in the semiconductor packages in which large size semiconductor chips were mounted, as shown in panel B of FIGS. 4a and 4b. These results demonstrate that composition specimen b is suitable for large size packages with large size semiconductor chips only. Irrespective of chip sizes, the packages which were subjected to VPS at 215° C. better withstood interface delamination than those which were subjected to IR flow at 235° C. This suggests that the higher the treatment temperature, up to a limit, the easier the interface delamination occurs.

With the use of the 'intermediate' composition specimen C of the present invention, which was modified from a 'soft' epoxy resin composition, gave excellent results, or no interface delamination, to the VPS-treated packages in which small size semiconductor chips were mounted, as shown in panel C of FIG. 3a, while satisfactory results were given to the IR reflow-treated packages, as shown in panel C of FIG. 3b. In all of the semiconductor packages in which large size semiconductor chips were mounted, excellent results were also obtained when the composition specimen C was applied therefor, as shown in panel C of FIGS. 4a and 4b. Therefore, the composition specimen C according to the present invention allowed relatively excellent results irrespective of semiconductor chip size. Accordingly, the composition specimen C can be used for semiconductor chips of a wide range of sizes.

In contrast, unsatisfactory results were realized with the 'intermediate' composition specimens D, E and F, which were also modified from 'soft' epoxy resin compositions. Specimens D and F showed similar results to those of the specimen A. Although specimen E gave good results to the VPS-treated packages in which small size semiconductor chips were mounted, poor results were obtained in other cases. From these results, the composition specimens D, E and F, even though modified into 'intermediate compositions, were found to be suitable only for the small size packages with small size semiconductor chips.

Figure 5:
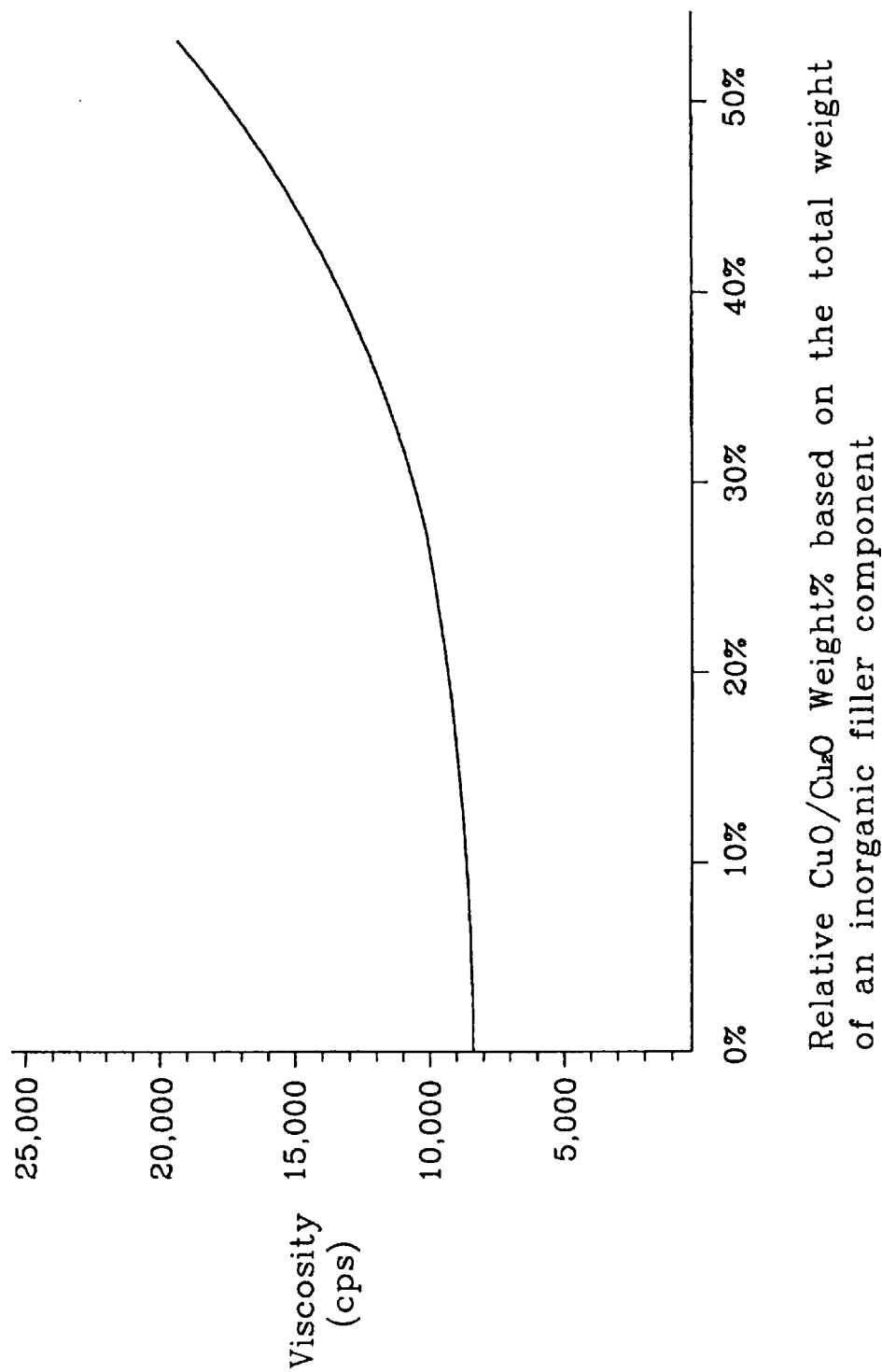
FIG. 5 is a graph illustrating viscosity variations of compositions according to CuO and/or Cu$_2$O content.

Taken together, the data of FIGS. 3 and 5 showed that the interface delamination-preventive effect of the composition specimen C is attributed to the addition of CuO and/or $Cu_2O$.

Workability Test Viscosity Measurement

There were prepared six composition specimens, each comprising 30 weight parts of the resin component and 100 weight parts of the inorganic filler component, in which $CuO/Cu_2O$ was present at an amount of 0%, 10%, 20%, 30%, 40% and 50%, respectively, based on the total weight of the filler component, and contained Ag amounting correspondingly to 100%, 90%, 80%, 70%, 60% and 50%. The viscosities of the composition specimens were measured at 25° C. The results are shown in FIG. 5.

As seen in the curve of FIG. 5, the viscosity is 8,350 cps when no $CuO/Cu_2O$ is contained, and gradually increases up to 14,600 cps until the $CuO/Cu_2O$ reaches 40%. After this level, the viscosity starts to sharply increase and reaches 18,400 cps when the $CuO/Cu_2O$ amounts to 50%.

In the cases where an auto-dispenser is used to dispense an epoxy resin composition on semiconductor chip paddles, the auto-dispenser cannot efficiently work when the epoxy resin composition is 15,000 cps in viscosity. With the viscosity as high as 20,000 cps, it is impossible for the dispenser to function.

Accordingly, $CuO/Cu_2O$ is added at an amount of approximately 0.1 to 50% by weight based on the total weight of the inorganic filler component, although there may be a slight modulation depending on the relative amount of the resin component to the inorganic filler component.

As described above, the composition in accordance with the present invention provides a significant degree of modulus such that wire bonding defects are not caused by a bonding machine while providing a high degree of adhesive strength to prevent the occurrence of interface delamination and/or cracking. Further, the inventive composition can be applied for use with semiconductor chips of a wide variety of sizes, in addition to providing a substantial degree of workability.

Although the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An epoxy resin composition for bonding semiconductor chips comprising an adhesive resin component, a curing agent, a diluent, a curing promoter and a thixotropic agent, and an inorganic filler component, wherein said resin component is approximately 10–50% by weight, and said inorganic filler component is approximately 50–90% by weight, and wherein the inorganic filler component comprises a copper ingredient and a silver ingredient, said copper ingredient being selected from the group consisting of CuO, $Cu_2O$ and the mixtures thereof being approximately 0.1–50% by weight based on the total weight of said inorganic filler component, and said silver ingredient being approximately 50–99.0% by weight based on the total weight of said inorganic filler ingredient.

2. An epoxy resin composition as set forth in claim 1, wherein said copper ingredient is approximately 5–25% by weight based on the total weight of said inorganic filler component.

3. An epoxy resin composition as set forth in claim 1 or claim 2, wherein said resin component is 20–40% by weight and said inorganic filler component is 60–80% by weight.

4. An epoxy resin composition as set forth in claim 2, wherein said composition has a modulus of 2 to $4 \times 10^9$ Pa at 0° C., and the modulus gradually decreases at temperatures between 25 and 150° C., and decreases to $7 \times 10^7$ to $3 \times 10^9$ Pa at above 150° C.

5. An epoxy resin composition as set forth in claim 2, wherein said composition ranges in viscosity from 8,000 to 20,000 cps at 25° C.

6. An epoxy resin composition as set forth in claim 1, wherein said composition gives an adhesive layer, formed between a semiconductor chip and a paddle of a lead frame, ranging in adhesive strength after cure from 100 to 170 $Kgf/cm^2$.

* * * * *

UNITED STATES PATENT AND TRADEMARK OFFICE
CERTIFICATE OF CORRECTION

PATENT NO.      : 6,225,379 B1                                        Page 1 of 1
DATED           : May 1, 2001
INVENTOR(S)     : Jae-Sung Kwak It is certified that error appears in the above-identified patent and that said Letters Patent is hereby corrected as shown below:

<u>Title page,</u>
Item [73], the correct assignees are:

-- Amkor Technology Korea, Inc.
957, Daechon-dong, Puk-gu
Kwangju, Korea

National Starch and Chemical Investment Holding Corporation
1000 Uniquema Boulevard
Newcastle, Delaware 19720

Amkor Technology, Inc.
1345 Enterprise Drive
West Chester, Pennsylvania --

Signed and Sealed this

Sixteenth Day of July, 2002

*Attest:*

JAMES E. ROGAN
*Attesting Officer*                  *Director of the United States Patent and Trademark Office*